United States Patent
Yamaguchi

(10) Patent No.: US 11,515,169 B2
(45) Date of Patent: Nov. 29, 2022

(54) METHOD OF MAKING A SEMICONDUCTOR DEVICE INCLUDING ETCHING OF A METAL SILICATE USING SEQUENTIAL AND CYCLIC APPLICATION OF REACTIVE GASES

(71) Applicant: Hitachi High-Tech Corporation, Tokyo (JP)

(72) Inventor: Yoshihide Yamaguchi, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 33 days.

(21) Appl. No.: 17/238,416

(22) Filed: Apr. 23, 2021

(65) Prior Publication Data
US 2021/0335622 A1    Oct. 28, 2021

Related U.S. Application Data

(62) Division of application No. 15/906,933, filed on Feb. 27, 2018, now abandoned.

(30) Foreign Application Priority Data

Oct. 31, 2017    (JP) .............................. JP2017-209918

(51) Int. Cl.
*H01L 21/311*    (2006.01)
*H01L 21/02*    (2006.01)
(Continued)

(52) U.S. Cl.
CPC ........ *H01L 21/31116* (2013.01); *C23C 16/18* (2013.01); *C23C 16/4412* (2013.01);
(Continued)

(58) Field of Classification Search
None
See application file for complete search history.

(56) References Cited

U.S. PATENT DOCUMENTS 10,460,953 B2 *  10/2019  Yamaguchi ....... H01L 21/02181
2006/0215143 A1   9/2006  Yamaguchi et al.
(Continued)

FOREIGN PATENT DOCUMENTS

| JP | H02194626 A | 8/1990 |
| JP | 2009252895 A | 10/2009 |
| JP | 2015191922 A | 11/2015 |

OTHER PUBLICATIONS

Steven George et al.; "Thermal Atomic Layer Etching Using Sequential, Self-Limiting Fluorination and Ligand-Exchange Reactions"; Proceedings of 38th International Symposium on Dry Process; Nov. 21-22, 2016; pp. 15-16.
Robert Weast et al. "The electromagnetic spectrum", CRC Handbook of Chemistry and Physics, 1982, pages E-201, 63rd Ed.
Office Action dated Oct. 9, 2018 in corresponding Taiwanese Application No. 107106307.

*Primary Examiner* — Erik Kielin
(74) *Attorney, Agent, or Firm* — Miles & Stockbridge, P.C.

(57) ABSTRACT

A semiconductor manufacturing apparatus includes: a stage installed inside a processing chamber and holding a semiconductor substrate having a high-k insulating film including silicate; and a gas supply line including a first system supplying reactive gas to the processing chamber and a second system supplying catalytic gas to the processing chamber, wherein mixed gas which includes complex forming gas reacting with a metal element included in the high-k insulating film to form a first volatile organometallic complex and complex stabilizing material gas increasing stability of the first organometallic complex is supplied as the reactive gas, and catalytic gas using a second organometallic complex, which modifies the high-k insulating film and promotes a formation reaction of the first organometallic complex, as a raw material is supplied.

11 Claims, 5 Drawing Sheets

(51) Int. Cl.
    *C23C 16/455* (2006.01)
    *C23C 16/18* (2006.01)
    *H01L 21/3105* (2006.01)
    *H01L 29/51* (2006.01)
    *C23C 16/44* (2006.01)
    *H01L 21/67* (2006.01)
    *H01L 21/28* (2006.01)

(52) U.S. Cl.
    CPC ...... *C23C 16/45559* (2013.01); *H01L 21/022* (2013.01); *H01L 21/02041* (2013.01); *H01L 21/28194* (2013.01); *H01L 21/31056* (2013.01); *H01L 21/31122* (2013.01); *H01L 21/31144* (2013.01); *H01L 21/67017* (2013.01); *H01L 21/67069* (2013.01); *H01L 29/517* (2013.01); *H01L 29/518* (2013.01)

(56) References Cited

U.S. PATENT DOCUMENTS

| | | |
|---|---|---|
| 2008/0032514 A1 | 2/2008 | Sano et al. |
| 2013/0203267 A1 | 8/2013 | Pomarede et al. |
| 2015/0279697 A1 | 10/2015 | Matsuda et al. |
| 2018/0076051 A1 | 3/2018 | Shinoda et al. |
| 2018/0166255 A1 | 6/2018 | Blomberg et al. |
| 2018/0174860 A1 | 6/2018 | Kanarik |
| 2018/0182634 A1* | 6/2018 | Smith ............... H01J 37/32899 |
| 2019/0055654 A1* | 2/2019 | George ............ H01L 21/31122 |

* cited by examiner

*FIG. 5*

|  | REACTION RATIO | |
|---|---|---|
|  | NON-EXISTENCE OF CATALYST | EXISTENCE OF CATALYST |
| SILICON | 0% | 0% |
| TITANIUM NITRIDE (TiN) | 0% | 0% |
| LANTHANUM SILICATE | 0% | 19% |

METHOD OF MAKING A SEMICONDUCTOR DEVICE INCLUDING ETCHING OF A METAL SILICATE USING SEQUENTIAL AND CYCLIC APPLICATION OF REACTIVE GASES

CLAIM OF PRIORITY

The present application claims priority from Japanese patent application JP 2017-209918 filed on Oct. 31, 2017, the content of which is hereby incorporated by reference into this application.

BACKGROUND OF THE INVENTION

1. Field of the Invention

The present invention relates to a method for manufacturing a semiconductor device having a high-k insulating film.

2. Description of the Related Art

As the demands for miniaturization, higher speed and performance, and low power consumption of the state-of-the-art semiconductor devices continue to grow and a gate insulating film becomes thinner, the use of a metal oxide film material having a specific dielectric constant higher than that of a silicon oxide ($SiO_2$) film or silicon oxynitride (SiON) film is getting increased. For example, studies for applying a high-k metal oxide film material, which includes elements such as hafnium (Hf), zirconium (Zr), tantalum (Ta), titanium (Ti), yttrium (Y), lanthanum (La), and lanthanides as rare earth and include metal oxides hard to be reduced at an interface with silicon (Si) at high temperature or composite oxides of these metals and silicon (Si), to the gate insulating film are in progress.

However, it is not always easy to perform fine processing on these high-k insulating film materials. For example, it is known that the film quality deteriorates due to wet treatment of a fine processing process of a lanthanum oxide film ($La_2O_3$), in particular, a photolithography process. Various new technologies have been proposed for that problem. For example, JP 2009-252895 A discloses a technology for preventing a lanthanum film from deteriorating due to the wet treatment process by introducing a multilayer structure into the gate insulating film. In addition, JP 2015-191922 A discloses a technology of performing dry etching processing on a metal oxide including hard-to-etch materials by using a reactive ion etching method using gas including boron trichloride ($BCl_3$).

Steven George, Younghee Lee, Jaime DuMont, Nicholas Johnson and Amy Marquardt "Thermal Atomic Layer Etching Using Sequential, Self-Limiting Fluorination and Ligand-Exchange Reactions" (Proceedings of 38th International Symposium on Dry Process, Nov. 21-22, 2016, pp 15-16) as an approach different from the JP 2009-252895 A and JP 2015-191922 A discloses a technology of performing etching processing on an insulating film by fluorinating a surface of the insulating film material, converting the insulating film into a volatile organometallic complex by a ligand-exchange reaction between metal fluoride and an organic compound, and then evaporating and removing the volatile organometallic complex.

SUMMARY OF THE INVENTION

In the case of performing fine dimensional pattern processing in the wet treatment, there is a possibility that the pattern may collapse due to a surface tension of wet treatment liquid or rinse liquid. In contrast, in a reactive ion etching (RIE) technology using gas including a halogen-based component such as $BCl_3$, since the dry etching is used, it is possible to avoid the problem of the pattern collapse, but since a vapor pressure of the halide of the metal element constituting the high-k insulating film material is low, it is not easy to secure a sufficient etching rate and there is also a need to improve an etching selective ratio with silicon (Si).

The technique of Steven George, Younghee Lee, Jaime DuMont, Nicholas Johnson and Amy Marquardt "Thermal Atomic Layer Etching Using Sequential, Self-Limiting Fluorination and Ligand-Exchange Reactions" (Proceedings of 38th International Symposium on Dry Process, Nov. 21-22, 2016, pp 15-16) is also a dry etching technique, and has been shown that it is possible to etch hafnium oxide film ($HfO_2$) or aluminum oxide ($Al_2O_3$) which is one of the high-k insulating film materials. However, Steven George, Younghee Lee, Jaime DuMont, Nicholas Johnson and Amy Marquardt "Thermal Atomic Layer Etching Using Sequential, Self-Limiting Fluorination and Ligand-Exchange Reactions" (Proceedings of 38th International Symposium on Dry Process, Nov. 21-22, 2016, pp 15-16) discloses the $HfO_2$ film and the $Al_2O_3$ film as a material that can be removed, but does not clearly disclose whether dry etching of high-k insulating film materials other than those is possible or not. Further, from a practical point of view, it is considered essential to further improve the etching rate of the high-k insulating film material that can be realized by this technique.

When the high-k insulating film is formed on a Si wafer, a silicate film is generated at an interface with Si. For this reason, it is necessary to realize the dry etching of the silicate film formed by the high-k insulating film material and the Si for the processing of the semiconductor device having the high-k insulating film.

The inventor found thermal dry etching processing of converting a high-k insulating film into a state of a volatile organometallic complex and then evaporating or subliming the volatile organometallic complex to remove by studying etching chemistry of a gate insulating film material, and as a result, has reached the present invention. Since the dry etching is used, defects of the fine pattern collapse due to the wet treatment liquid do not occur, and since the volatile metallic complex having a high vapor pressure is used, the etching can be performed at high speed.

A first aspect of the present invention is a semiconductor manufacturing apparatus, including: a container in which a processing chamber is provided; a stage provided inside the processing chamber and holding a semiconductor substrate having a high-k insulating film including silicate; a gas supply line including a first system supplying reactive gas to the processing chamber and a second system supplying catalytic gas to the processing chamber; and a lamp heater which emits infra-red light from a light source to the semiconductor substrate held on the stage, the lamp heater including an ultra violet light filter to cut the ultra violet light with wavelength less than 400 nm from the light source, wherein the reactive gas comprises a mixed gas which includes a complex forming gas reacting with a metal element included in the high-k insulating film to form a first volatile organometallic complex and complex stabilizing material gas which increases a stability of the first volatile organometallic complex, and the catalytic gas comprises gas of material derived from a second organometallic complex as a raw material, which modifies the high-k insulating film to form the first volatile organometallic complex, the metal element included in the high-k insulating film is a metal element classified in a fifth period in a periodic table and succeeding periods, and the high-k insulating film includes silicate of the metal element.

A second aspect of the present invention is a method for manufacturing a semiconductor device, including: mounting a semiconductor substrate, in which a mask layer having a predetermined pattern shape is formed on a high-k insulating film including silicate, in a processing chamber; desorbing gas or foreign matter adsorbed on a surface of the semiconductor substrate; supplying catalytic gas under decompression and heating; cooling the semiconductor substrate after a supply of the catalytic gas is stopped and supplying reactive gas to the processing chamber in a state in which a temperature of the semiconductor substrate falls below a predetermined temperature; decompressing and heating an inside of the processing chamber by stopping the supply of the reactive gas; and exhausting a first organometallic complex from the processing chamber by vaporizing the first organometallic complex generated by reacting with a metal element included in the high-k insulating film.

It is possible to selectively and rapidly etch the high-k insulating film.

BRIEF DESCRIPTION OF THE DRAWINGS

FIG. 5 is a diagram illustrating a reaction ratio of mixing etching gas with a substance.

DESCRIPTION OF THE PREFERRED EMBODIMENTS

Figure 1:
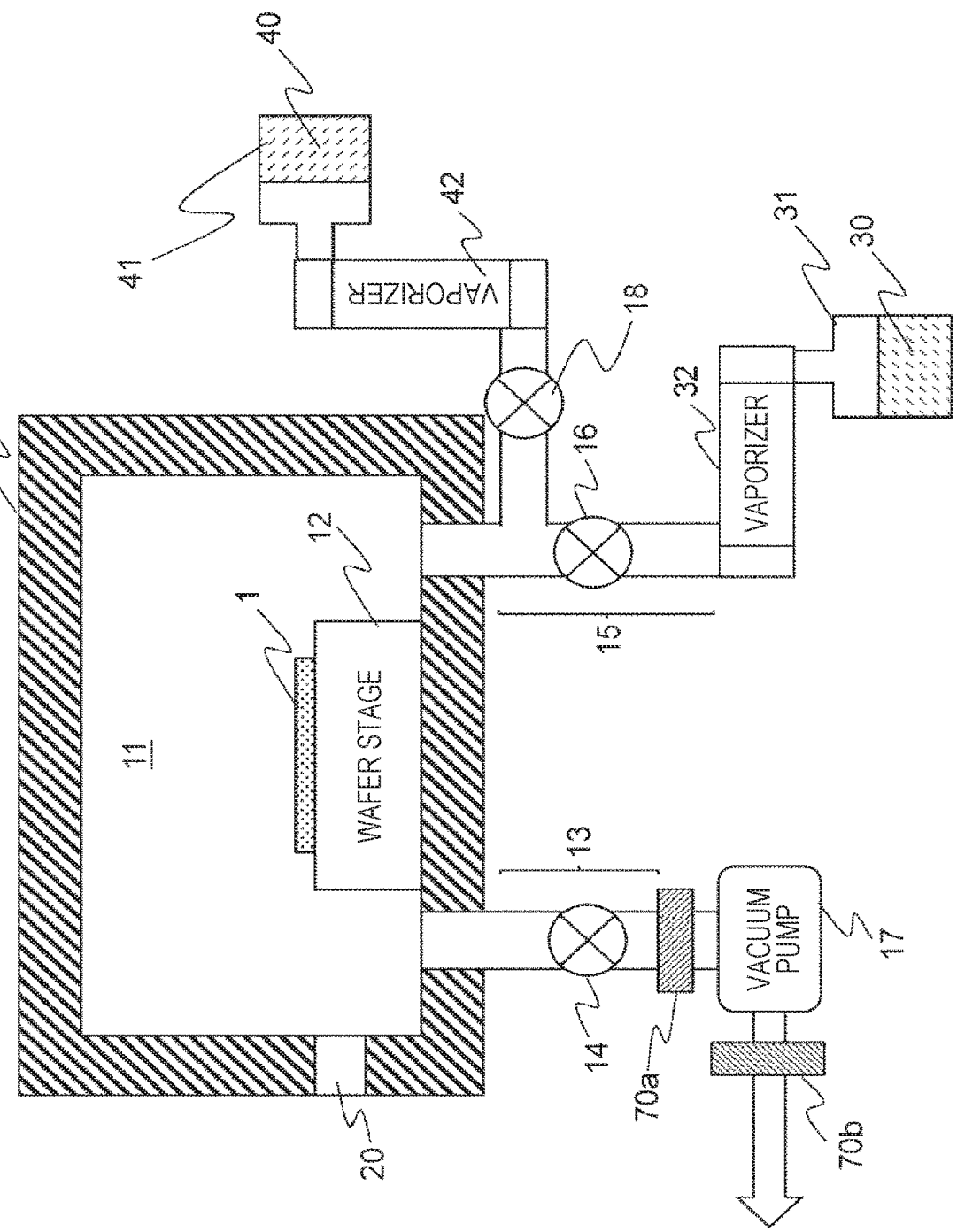
FIG. 1 is a schematic diagram of a semiconductor manufacturing apparatus (processing portion)

FIG. 1 shows a semiconductor manufacturing apparatus (processing portion) of the present embodiment. The semiconductor manufacturing apparatus has a container 10 configuring a vacuum chamber, in which an inside of the container 10 is provided with a processing chamber 11 and an inside of the processing chamber 11 is provided with a wafer stage 12 for holding a semiconductor substrate (wafer) 1. A vacuum line 13 and a gas supply line 15 are connected to the container 10, an opening/closing valve 14 is connected to the vacuum line 13, and an opening/closing valve 16 and an opening/closing valve 18 are each installed on the gas supply line 15. By this configuration, an internal pressure of the processing chamber 11 can be controlled by controlling and adjusting a vacuum system and a gas supply system. Further, the semiconductor substrate 1 outside the processing chamber 11 is conveyed into the processing chamber 11 or the semiconductor substrate 1 inside the processing chamber 11 is conveyed out of the processing chamber 11, through a wafer conveyance port 20 provided in the container 10.

Although not shown, the semiconductor manufacturing apparatus is provided with a heater for heating or a heating unit such as a halogen lamp and a cooling unit such as a chiller pipe for cooling, and a temperature of the container 10, the processing chamber 11, and the wafer stage 12 is adjusted so that a surface temperature of the semiconductor substrate 1 falls within a proper range. Similarly, various functional units or various sensors used for manufacturing a semiconductor device, for example, a plasma generation source, an external network connection device, an uninterruptible power supply, a pressure gauge, a thermometer, a flow meter or the like are provided as necessary.

In the semiconductor manufacturing apparatus, the wafer stage 12 is provided with a wafer chucking mechanism for certainly grasping the wafer which is being etched. According to the present embodiment, an electrostatic chuck for electrostatically chucking the wafer can be applied. In the case of an electrostatic adsorption method, a density distribution of plasma generated in the processing chamber may be affected by an electric field generated near a wafer surface. Although the etching principle of the present embodiment will be described later, unlike an RIE method, ion species or radical species in the plasma are not used for processing an insulating film, and the generation of the plasma is limited to, for example, a pretreatment process such as removal of adsorbed gas on the surface. For this reason, there is no risk of affecting processing accuracy of the insulating film even if the electrostatic chuck is applied. Any of a coulombs force type, a gradient force type, and a Johnsen-Rahbek type is selectively applied according to a kind and a content of a material to be etched and etching processing. It may be other chucking mechanisms such as a mechanical chuck.

The gas supply line 15 is divided into two systems. A chemical liquid tank 31 for storing a chemical liquid 30 as a raw material for etching gas and a vaporizer 32 for vaporizing the chemical liquid 30 are connected to a first system. A chemical liquid tank 41 for storing a chemical liquid 40 as a raw material for catalytic gas and a vaporizer 42 for vaporizing the chemical liquid 40 are connected to a second system. The chemical liquid 30 is a mixed raw material liquid for generating mixed etching gas including complex forming gas which is a component for converting a high-k insulating film formed on the wafer 1 into a volatile organometallic complex and complex stabilizing material gas which is a component for increasing stability of the volatile organometallic complex. The chemical liquid 30 is sent to the vaporizer 32 to generate reactive gas (hereinafter referred to as a mixed etching gas) including a mixture of the above-described plurality of functional gas components. The chemical liquid 30 at least includes a raw material for the complex forming gas and a raw material for the complex stabilizing material gas. The chemical liquid 40 is a chemical catalyst stock liquid for generating a catalytic gas which promotes a conversion reaction for converting the high-k insulating film, in particular, a silicate layer included in the high-k insulating film into the volatile organometallic complex. The chemical liquid 40 is sent to the vaporizer 42 to generate the catalytic gas. The chemical liquid 40 at least includes a catalyst raw material for generating the catalytic gas.

In the present embodiment, the mixed chemical liquid 30 mixed with plural raw materials for several kinds of gases is introduced into a single vaporizer 32 and a plurality of components are simultaneously gasified to generate the mixed etching gas, which is introduced into the processing chamber 11 through the gas supply line 15. As the structure of the vaporizer 32, for example, a bubbling type can be applied. By using a vaporizer having a simple structure, it is possible to reduce the cost of the semiconductor manufacturing apparatus and minimize the installation area. In addition to the bubbling type, a known vaporizer such as a direct injection type, an ultrasonic atomization method, or a combination thereof can be used.

Meanwhile, since the catalytic gas obtained from the chemical catalyst stock liquid 40 has vaporization conditions different from those of the complex forming gas or the complex stabilizing material gas, the vaporizer 42 separately provided from the vaporizer 32 for vaporizing the complex forming material or the complex stabilizing material is used to vaporize the complex forming material or the complex stabilizing material. The chemical catalyst stock liquid 40 is a substance having properties for increasing reactivity of the complex forming material or the complex stabilizing material. To appropriately control the reactivity of the complex forming material or the complex stabilizing material, it is preferable that the single vaporizer avoids vaporizing the mixture of the chemical liquid 30 including the raw material and the chemical catalyst stock liquid 40. For this reason, in the configuration of FIG. 1, the chemical liquid tank 41 of the chemical catalyst stock liquid 40 and the chemical liquid tank 31 of the raw material for the complex forming gas or the complex stabilizing material gas are separately provided to prevent the chemical catalyst stock liquid 40 from being mixed with the chemical liquid 30 including the raw material for the complex forming gas and the complex stabilizing material gas. As the operating conditions of the vaporizer 32 and the vaporizer 42, not only a temperature control, but a pressure control or a combination of the pressure control and the temperature control is also possible. Surface treatment or the like required to suppress the reaction with the complex forming gas, the complex stabilizing material gas, the catalytic gas or the like is performed on an inner wall of a pipe from the vaporizer 32 and the vaporizer 42 to the processing chamber, and a pipe line or the like is provided with mechanisms for heat insulation or heating for preventing re-adhesion or condensation of these various kinds of gases, cleaning for removing an adhesive material or the like as necessary.

Although not shown, a carrier gas supply system for adjusting a supply concentration of the mixed etching gas and the catalytic gas in addition to a system for supplying the mixed etching gas and the catalytic gas is also connected to the gas supply line 15, and if necessary, the concentration of the mixed etching gas and the catalytic gas supplied into the processing chamber 11 can be adjusted within a range of 0 to 100%. As the carrier gas, general inert gases such as nitrogen or argon may be used.

In addition, in the configuration of FIG. 1, an etching gas supply system which is one system for generating the mixed etching gas is illustrated, but vaporizers of a plurality of systems supplying the etching gas may be connected to the gas supply line 15 in consideration of the complication of the structure of the semiconductor device to be manufactured and the diversification and multi-layering of the high-k insulating film material to be etched. In addition, in the case where the vaporizers of the plurality of systems are provided, the chemical liquid to be filled in each of the chemical liquid tanks may be the mixed chemical liquid of a plurality of raw material liquids or a single chemical stock liquid.

(1) It is possible to easily adjust the mixing ratio of the mixed etching gas by vaporizing the single chemical stock liquid in the vaporizers of each of the plurality of systems or the vaporizer of at least one system. For example, in the case where first mixed etching gas of gas A and gas B is generated from the vaporizer of the first system, etching gas of gas C is generated from the vaporizer of the second system, the first mixed etching gas acts on a first high-k insulating film material, and second mixed etching gas in which the gas C is also mixed with the first mixed etching gas acts on a second high-k insulating film material (which has an element composition different from that of the first high-k insulating film material), the vaporizer of the first system is used when the first high-k insulating film layer of the semiconductor device is etched and the vaporizers of the first system and the second system are used together when the second high-k insulating film layer is etched, such that it is possible to easily etch the high-k insulating film layer having a plurality of different materials included in the semiconductor device.

(2) In the case where the mixed chemical liquid is vaporized by each of the vaporizers of the plurality of systems, for example, the vaporizer of the first system can generate the first mixed etching gas of the gas A and the gas B and the vaporizer of the second system can generate third mixed etching gas of the gas C and the gas B. In this case, if both the first mixed etching gas and the third mixed etching gas act on the same high-k insulating film material, it may be considered that the vaporizers of the first system and the second system are used together to etch the predetermined high-k insulating film layer of the semiconductor device. In addition, when the first mixed etching gas acts on the first high-k insulating film material and the third mixed etching gas acts on the second high-k insulating film material (which has the element composition different from that of the first high-k insulating film material), the vaporizer of the first system is used when the first high-k insulating film layer of the semiconductor device is etched and the vaporizer of the second system are switched and used when the second high-k insulating film layer is etched, such that it is possible to easily etch the high-k insulating film layer having the plurality of different materials included in the semiconductor device.

Figure 2:
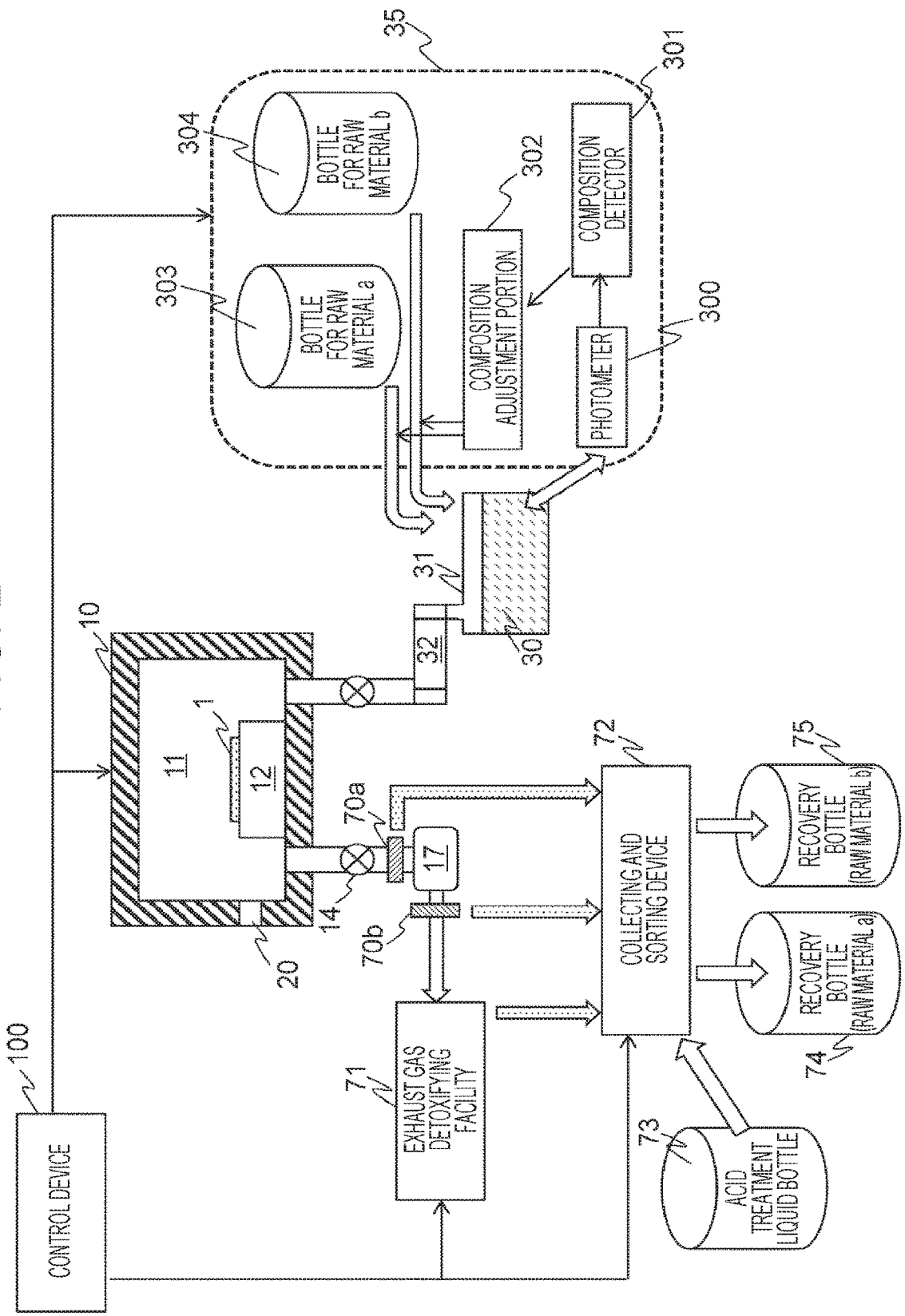
FIG. 2 is a diagram showing an example of a schematic diagram of the semiconductor manufacturing apparatus (including peripheral units)

The vacuum line 13 is provided with a cold trap 70 to prevent the mixed etching gas discharged as unreacted or a compound (volatile organometallic complex) generated by the etching processing from leaking to the environment. The cold trap 70 is installed at least one location among the place between the container 10 and the opening/closing valve 14, the place between the opening/closing valve 14, and the place in the exhaust system of the vacuum pump 17 to cool and recover the unreacted etching gas discharged together with the carrier gas, the catalytic gas, and the compound (volatile organometallic complex) generated by the etching processing. FIG. 2 shows a configuration example of an apparatus in which a first cold trap 70a is provided between the opening/closing valve 14 and the vacuum pump 17 and a second cold trap 70b is provided in the exhaust system of the vacuum pump 17, and for simplification of description, shows only element portions of a gas supply line 15 of one system having the simplest structure. The exhaust system of the vacuum pump 17 is finally connected to an exhaust gas detoxifying facility 71 and extra etching gas, the catalytic gas, the volatile organometallic complex or the like which cannot be cold-condensed by the cold trap 70 are adsorbed and collected by an adsorbent to be removed. FIG. 2 shows the arrangement example in which the cold trap 70b and the exhaust gas detoxifying facility 71 are connected to the exhaust system of the vacuum pump 17 in series, but it is not limited to the arrangement example.

To beneficially utilize the chemical substances cold-condensed by the cold trap 70 and/or the exhaust gas detoxifying facility 71, a collecting and sorting device 72 recovers the collected chemical substances as they are, or decomposes the collected chemical substances as needed to collect and sort valuable substances. Specifically, the mixed etching gas discharged as unreacted, the catalytic gas, or the compound (volatile organometallic complex and the like) generated by the etching processing is mixed and reacted with an acid treatment liquid supplied from an acid treatment liquid bottle 73 in the collecting and sorting device 72. By reacting the chemical substances collected by the cold trap 70 and the exhaust gas detoxifying facility 71 with the acid treatment liquid under appropriate conditions, some of the chemical substances are acid-decomposed, and the raw material liquid a and the raw material liquid b included in the mixed chemical liquid 30 can be separated and regenerated from the acid-decomposed chemical substances. The separated and regenerated raw material liquids a and b are collected to recovery bottles 74 and 75, respectively.

The acid treatment liquid used in the collecting and sorting device 72 preferably is a liquid obtained by dissolving a substantially nonvolatile acidic substance in a non-aqueous polar solvent having a boiling point >200° C. The non-volatile acidic substance used herein preferably is a substance having an acid dissociation constant pKa of 3 or less as an index representing acidity of the acidic substance (acidity is stronger as the pKa value is smaller). It is determined whether or not the mixed etching gas or the compound recovered by the acid treatment liquid can be acid-decomposed based on a kind and reactivity of raw material liquid a, raw material liquid b or the like. Although the raw material suitable for the present embodiment is described below, these raw materials can be acid-decomposed if the pKa of the acidic substance is equal to or less than 3. By contrast, it is also possible to use an acidic substance having a lower acidity corresponding to the raw material if the acidic substance is selected according to the used raw material.

The collecting and sorting device 72 acid-decomposes the mixed etching gas, the catalytic gas, the volatile organometallic complex generated by the etching processing or the like, regenerates the raw material for the complex forming gas, the raw material for the complex stabilizing material gas, the raw material for the catalytic gas or the like, and recovers the regenerated raw materials in a form of a solution in which the regenerated raw materials are dissolved in a nonaqueous solvent. Further, a distillation device including a fractionator is used to perform a distillation operation on the solution of the nonaqueous solvent including the raw material for the complex forming gas, the raw material for the complex stabilizing material gas, the raw material for the catalytic gas or the like as a solute to fractionally distill these raw materials. To perform the fractionally distilling operation as simple as possible, a substance having a low boiling point is not used as the nonaqueous solvent or the acidic substance. In addition, if acetic acid, hydrochloric acid or the like which is a volatile acidic substance is used, there is a possibility that the separation is insufficient in a relatively simple fractionating device, for example, a fractionating device having a theoretical plate number of 20 or less. In this manner, in the case of using the low boiling point nonaqueous solvent or the low boiling point acidic substance, the raw material for the complex forming gas, the raw material for the complex stabilizing material gas, the raw material for the catalytic gas or the like are insufficiently separated from the nonaqueous solvent or the acidic substance only by the simple sorting and distillation operation, such that it is difficult to reuse the raw materials as they are or there are some restrictions in reusing the raw materials. In addition, when an aqueous solvent, alcohol or the like is used instead of the nonaqueous solvent, the regenerated raw material for the complex forming gas, the raw material for the complex stabilizing material gas, the raw material for the catalytic gas or the like reacts with the aqueous solvent, the alcohol or the like, and therefore there is a possibility that the recovered amount is decreased. For this reason, it is preferable to use the nonaqueous solvent as the solvent of the acid treatment liquid.

Specific examples of the nonaqueous polar solvent having a boiling point of higher than 200° C. may include tetramethylene sulfone (sulfolane), dimethylimidazolidinone, triglyme and the like. In addition, specific examples of the acidic substance having pKa<3 may include toluenesulfonic acid, methanesulfonic acid, phosphoric acid and the like. In contrast, there is a problem in that a fractionation process of volatile acids such as hydrochloric acid, nitric acid and formic acid becomes complicated as described above.

To recover and reuse the raw material, it is preferable to recover the chemical substances without impurities. From this viewpoint, when there is a possibility that impurities derived from the vacuum pump are mixed into the exhaust system of the vacuum pump 17, only chemical substances cold-condensed by the cold trap 70a installed in front of the vacuum pump 17 may be considered as a recovery target of a raw material, and others may be discarded. In addition, the cold trap 70a is disposed in front of the vacuum pump 17 to prevent the chemical substances from being mixed into the vacuum pump 17. When the chemical substances cold-condensed by the cold trap 70b installed in the exhaust system of the vacuum pump 17 or the exhaust gas detoxifying facility 71 are discarded, it is allowable to use the aqueous solvent or the alcohol instead of the nonaqueous solvent.

Next, a description will be given of a semiconductor manufacturing method performed by the semiconductor manufacturing apparatus in FIG. 1 or 2. The processing in the semiconductor manufacturing apparatus is controlled by a control device 100.

Figure 3:
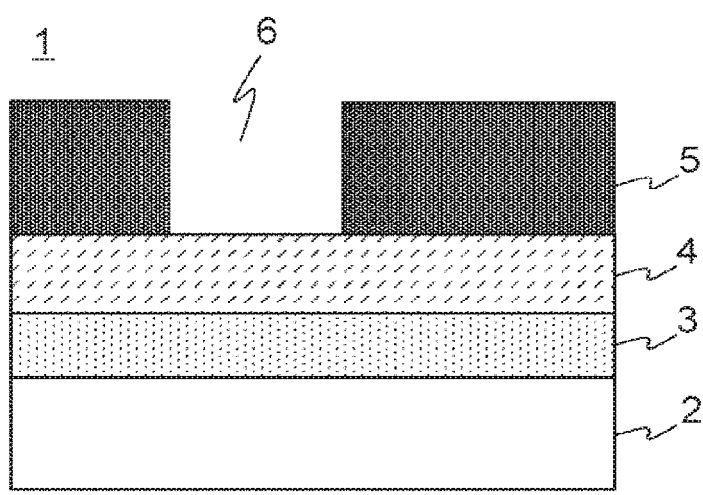
FIG. 3 is a diagram showing an example of a cross-sectional view of a semiconductor substrate.

First, a wafer conveyance device (not shown) conveys the semiconductor substrate (wafer) 1 into a desired position on the wafer stage 12 disposed in the processing chamber 11 through the wafer conveyance port 20 provided in the container 10. The conveyed semiconductor substrate 1 is adsorbed and fixed by a gripping force of the wafer stage 12. The high-k insulating film and a resist film, a hard mask film or the like having an opening pattern at a desired place are formed on the semiconductor substrate 1 in advance. FIG. 3 shows an example of a cross-sectional view of the semiconductor substrate (wafer) 1. A high-k insulating film 4 is formed on a silicon oxide ($SiO_2$) film 3 formed on a silicon (Si) substrate 2, and a hard mask 5 required to form a desired electrode pattern shape is also formed on the high-k insulating film 4. When lanthanum oxide ($La_2O_3$) as the high-k insulating film material is used, the high-k insulating film 4 is formed with lanthanum silicate film ($LaSi_xO_y$) which is a composite material of lanthanum oxide and silicon oxide in the vicinity of an interface with the silicon oxide film 3.

After the lanthanum oxide film is laminated on the silicon oxide film by the known sputtering method, physical vapor deposition (PVD) method, atomic layer deposition (ALD) method, chemical vapor deposition (CVD) method and the like, the lanthanum silicate can be easily formed as a film by the heat treatment of about 500 to 1000° C. to be mutually diffused from the interface between the lanthanum oxide and the silicon film. Depending on the quality of the silicon oxide film, the film formation condition or film thickness of the lanthanum oxide film, the temperature or time of the mutual diffusion by the heat treatment or the like, the lanthanum silicate having different relative mixing ratios of the lanthanum oxide and the silicon oxide is formed and becomes a laminated structure in which a film having different mixing ratios is laminated under the appropriate condition. In one example, it is possible to obtain the lanthanum silicate (LaSi$_x$O$_y$) having the complicated and diverse laminated structure so that the mixing ratio (La$_2$O$_3$:SiO$_2$) of the lanthanum oxide (La$_2$O$_3$) and the silicon oxide (SiO$_2$) in the region near the silicon oxide is 5:6, the mixing ratio (La$_2$O$_3$:SiO$_2$) of the lanthanum oxide (La$_2$O$_3$) and the silicon oxide (SiO$_2$) in the region far away from the silicon oxide is 2:1, and the mixing ratio (La$_2$O$_3$:SiO$_2$) of the lanthanum oxide (La$_2$O$_3$) and the silicon oxide (SiO$_2$) in the region near the middle between the two regions is 1:1. The film formation method, the film formation condition, the heat treatment condition and the like are selected to form a laminated structure film having a desired layer composition depending on the application of the semiconductor and the required reliability. Alternatively, the lanthanum silicate film having the desired composition is formed by sputtering film formation using the lanthanum silicate material having the desired composition, for example, La$_2$Si$_2$O$_7$ as a target material, and the lanthanum oxide (La$_2$O$_3$) film may be formed on the lanthanum silicate film to be used as the high-k insulating film 4 as needed.

To process the silicate film having the complicated and diverse laminated structure into the desired shape, the etching technique with high likelihood with respect to the composition change of the film to be processed is required. For this reason, after the processing of modifying the surface of the film to be processed into the state where the surface of the film to be processed easily reacts with the complex forming gas is performed in advance, the processing of reacting the surface of the film to be processed with the complex forming gas or the complex stabilizing material gas is performed. Specifically, the catalytic substance having the function of promoting the reaction of converting the surface of the film to be processed into the organometallic complex by the action of the
complex forming gas reacts on the surface of the film to be processed in advance.

Although the action of the catalytic substance will be described later, by selecting the kind or amount of raw materials depending on the material of the film to be processed and adjusting the temperature condition or the decompressed condition to appropriately adjust how much the surface of the film to be processed is modified, it is possible to correspond to dry etching of a high-k insulating film material other than the lanthanum silicate, for example, various kinds of high-k insulating film materials such as lanthanum oxide, hafnium oxide, lanthanum hafnium silicate, and hafnium silicate. Due to the presence of the catalytic substance for the etching of the silicate layer, the etching of the high-k insulating material layer is not inhibited. It should be noted that the material for the high-k insulating film which becomes a film to be processed is selected to conform to the specifications and characteristics of the device to be manufactured, and is oxide including metal elements classified in a fifth period in a periodic table of elements such as Y, Zr, La, Hf, and Ta and the succeeding periods.

Figure 4:
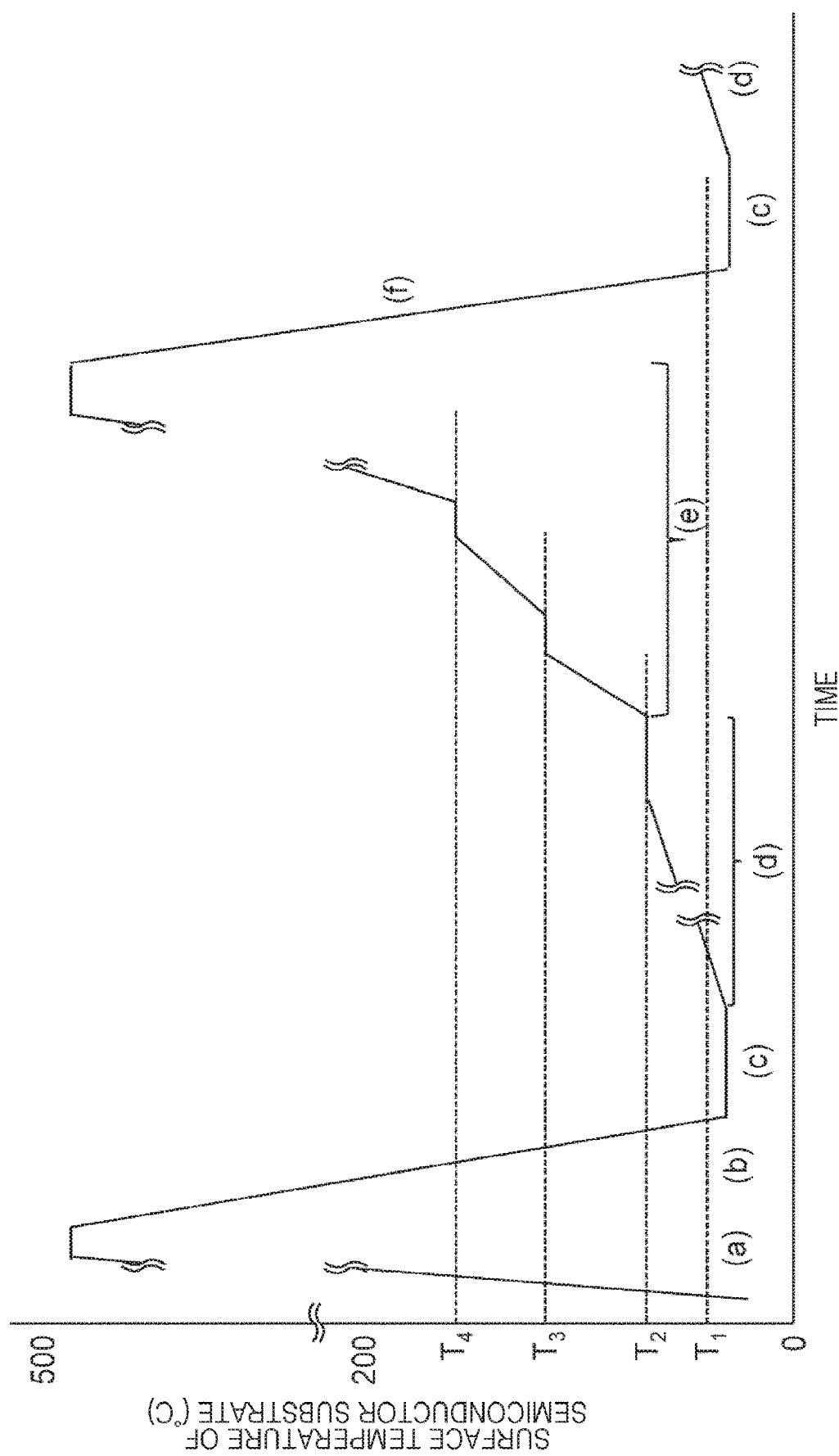
FIG. 4 is a diagram schematically showing an example of a surface temperature cycle of the semiconductor substrate in an etching process.

The hard mask film 5 and a photoresist film are sequentially formed on the high-k insulating film 4, a desired pattern is transferred to the photoresist film using a photolithography technology or the like, and the hard mask 5 is processed using the resist pattern as the mask to expose a part of the high-k insulating film 4. FIG. 3 shows an example of the cross section of the remaining resist pattern shape. It should be noted that a layer configuration formed on the semiconductor substrate (wafer) 1 is not limited to the example of FIG. 3. For example, an insulating layer formed under the high-k insulating film 4 may be a silicon nitride (SiN) film or a tungsten (W) film. The semiconductor manufacturing apparatus of the present embodiment removes an exposed part 6 by selective etching. In this selective etching, a non-plasma-like dry etching technology as described below is applied. FIG. 4 schematically shows one cycle of the temperature cycle of the semiconductor substrate surface in the etching process of the present embodiment. It should be noted that FIG. 4 is intended to make it easy to understand points of the temperature control in the etching process of the present embodiment, in which there is a case where an actually generated temperature, a temperature gradient, or a necessary control time differs from the temperature cycle displayed in FIG. 4 in detail since they depend on a kind of materials to be etched, a kind of complex forming materials, a structure and a layer configuration of the semiconductor device and the like.

After the semiconductor substrate 1 is fixed on the wafer stage 12, the insides of the container 10 and the processing chamber 11 are decompressed, the semiconductor substrate 1 is heated while being decompressed, and gases (water vapor and the like) or foreign matters adsorbed on the surface of the semiconductor substrate 1 are desorbed (period (a)). After it is confirmed that the desorption of the gas component adsorbed on the surface of the semiconductor substrate 1 is almost completed based on a display by an indication of a pressure gauge installed in the container 10 or the processing chamber 11, the heating of the semiconductor substrate 1 is stopped while the semiconductor substrate 1 being decompressed and cooling is started (period (b)). Any known means can be used for the decompression or the heating/cooling. As described below, since the processing of temperature rising or heat releasing (temperature falling) among a next series of processings is performed a plural of times, a heating/cooling mechanism suitable for rapid heating or rapid cooling is preferable. For example, it is preferable to control the surface temperature of the semiconductor substrate 1 to rapidly reach a desired temperature by combining a lamp type heating mechanism such as a halogen lamp or a xenon lamp and a pusher pin mechanism lifting up the semiconductor substrate 1 from the wafer stage 12. It should be noted that when the lamp type heating is performed, there is a need to select a wavelength of a lamp type heating light source by evaluating a behavior of the organometallic complex generated during the etching with respect to light. That is, there is a case where the catalytic gas or the organometallic complex generated by the reaction of the high-k insulating film 4 with the catalytic gas, the complex forming gas, and the complex stabilizing material gas is decomposed by light irradiation. For this reason, it is necessary to select the irradiation wavelength by evaluating a decomposition resistance of the organometallic complex against light in advance. Since the organometallic complex shows a light absorption behavior peculiar to the organometallic complex called metal to ligand charge transfer spectrum, there is a need to prevent light near the wavelength band from being irradiated. Meanwhile, since the organometallic complex also has property of efficiently absorbing light of a specific wavelength band and converting the light into heat, rapid heating can be performed by using a light source emitting light of the wavelength band. In general, since the metal to ligand charge transfer spectrum is often in a wavelength band of 350 nm or less, it is preferable to block the light in the wavelength band of 350 nm or less when the lamp type heating is performed. Meanwhile, generally, the organometallic complex has a high absorption efficiency of infrared light in a range of 2 to 10 µm. Therefore, for example, a halogen lamp installed with a yellow-cut-filter in order not to emit light including so-called ultraviolet light of 400 nm or less can be used as a light source.

It should be noted that since the heating in the period (a) is to separate gases or foreign matters adsorbed on the surface, it is also possible to apply the known methods, for example, plasma cleaning or the like other than the heating under the decompression. In addition, these methods may be used together with the heating processing, and it is possible to shorten the time required to separate gases or foreign matters by lowering the pressure as much as possible and being performed in a high vacuum state if possible.

Before the temperature of the semiconductor substrate 1 falls down to the temperature $T_1$ (hereinafter, referred to as mixed etching gas introduction upper limit temperature $T_1$), the catalytic gas vaporized by the vaporizer 42 is supplied through the gas supply line 15 while the degree of decompression is maintained. As described above, this catalytic gas is material gas having the function of promoting the conversion reaction for converting the high-k insulating film such as the lanthanum silicate into the volatile organometallic complex. The catalytic gas is supplied into the processing chamber 11 prior to falling down to the temperature $T_1$, and acts on the surface of the high-k insulating film (lanthanum silicate film) of the surface of the semiconductor substrate 1 to be modified to easily react with the complex forming gas or the complex stabilizing material gas introduced later. Since the temperature to allow the catalytic gas to modify the surface of the lanthanum silicate film preferably ranges from 150 to 250° C., more preferably, 200 to 250° C., it is preferable to supply a predetermined amount of catalytic gas within the temperature range, and if necessary, the catalytic gas may be sent while being diluted by being mixed with a small amount of carrier gas in a range in which the desired degree of decompression is maintained.

After the predetermined amount of catalytic gas is supplied, the extra catalytic gas remaining in the processing chamber 11 is exhausted before the semiconductor substrate 1 falls below the temperature $T_1$. Utilizing the carrier gas can remove the extra catalytic gas in a short period of time and shorten the time required to cool the substrate. After the semiconductor substrate 1 is cooled to the temperature $T_1$, the opening/closing valve 18 connected between the gas supply line 15 and the vaporizer 42 is closed, and the opening/closing valve 16 connected between to the gas supply line 15 and the vaporizer 32 is opened to supply the mixed etching gas of the complex forming gas and the complex stabilizing material gas into the processing chamber 11. Even the mixed etching gas of the complex forming gas and the complex stabilizing material gas is supplied while being diluted to an appropriate concentration with the carrier gas to suppress defects such as the gas adsorption to the gas pipe line, thereby smoothly supplying the gas (period (c)).

Here, in the case where the mixed etching gas of the complex forming gas and the complex stabilizing material gas is introduced into the processing chamber 11 in the state in which the temperature of the semiconductor substrate 1 exceeds the predetermined gas introduction upper limit temperature $T_1$, the lanthanum silicate film which is close to a mixed etching gas supply port and thus the thickness of the lanthanum silicate film at a place where the gas concentration is high is quickly reduced, whereas the defect that the thickness of the lanthanum silicate film at a place where the gas concentration is low such as a place away from the etching gas supply port or a bottom of a deep hole is not greatly reduced is apt to occur. To minimize the occurrence of the defects, the mixed etching gas is introduced into the processing chamber 11 after waiting until the temperature of the semiconductor substrate 1 falls below the predetermined gas introduction upper limit temperature $T_1$.

The gas introduction upper limit temperature $T_1$ is affected by various factors such as the dimension of the wafer 1, the material of the wafer, the film structure and film composition of the high-k insulating film, the composition of the mixed etching gas, the film thickness or the opening dimension of the resist film or the hard mask film, and the like. For this reason, there is a need to check and set the gas introduction upper limit temperature $T_1$ beforehand for each semiconductor device to be processed.

After the temperature of the semiconductor substrate 1 in a state in which the mixed etching gas is physically adsorbed on the surface of the high-k insulating film slowly rises by slow heating while being maintained not to exceed 200° C. even at the place where the temperature is highest in the semiconductor substrate 1 and thus is maintained at a temperature region near a predetermined temperature 12 for a certain time (period (d)), the rapid temperature rising to the highest temperature of 500° C. is performed while only the carrier gas (mixed etching gas concentration is zero) is supplied through the gas supply line 15 (period (e)). In the meantime, a balance between a supply rate of the mixed carrier gas supplied through the gas supply line 15 and an exhaust rate of the mixed carrier gas exhausted through the vacuum line 13 is adjusted to maintain an appropriately decompressed state.

The molecules of the complex forming gas and the molecules of the complex stabilizing material gas which are the components of the mixed etching gas are hopping diffused while being physically adsorbed on the surface of the semiconductor substrate 1 during the slow heating, such that the adsorption density (adsorption amount per unit surface area) on the surface of the semiconductor substrate 1 is uniform. In the period (d), to prevent the transition from the physical adsorption state to the chemical adsorption state before the adsorption density of the molecules of the complex forming gas and the molecules of the complex stabilizing material gas on the substrate surface reaches the uniform state, there is a need to control the processing conditions such as the temperature, the time, and the pressure and the optimization of the processing conditions for each semiconductor device to be manufactured is performed.

It should be noted that since the purpose of setting the period (d) is to uniformize the density at which the molecules of the complex forming gas and the molecules of the complex stabilizing material gas are adsorbed on the surface of the semiconductor substrate 1, the period (d) may be unnecessary as long as the sufficient uniformity of processing accuracy can be realized in the period (period (c)) in which the mixed etching gas is introduced. Alternatively, only the slow heating may be used.

After the in-plane uniformity of the adsorption density is achieved by the slow heating, only the carrier gas in which the concentration of the mixed etching gas is zero is supplied to remove the extra mixed etching gas, and then the rapid heating and the temperature rising are made while the carrier gas flows (period (e)). In the earliest stage of the rapid heating and temperature rising, the chemical reaction is generated between the molecules of the complex forming gas and the molecules of the complex stabilizing material gas included in the etching gas and the outermost molecular layer of the high-k insulating film 4 of the semiconductor substrate 1. In the chemical reaction, the molecules of the complex forming gas and the molecules of the complex stabilizing material gas react with the high-k insulating film 4 to be converted into the molecules of the volatile organometallic complex including the metal elements included in the high-k insulating film 4. The reaction of the metal elements included in the high-k insulating film with the molecules of the complex forming gas and the molecules of the complex stabilizing material gas adsorbed on the high-k insulating film 4 in the physically adsorbed state is performed at an interface therebetween, and one layer on the outermost surface of the high-k insulating film 4 is converted into the organometallic complex. After one layer on the outermost surface of the high-k insulating film 4 is converted into the organometallic complex, the generated organometallic complex prevents the molecules of the complex forming gas from being in direct contact with the high-k insulating film 4 to suppress the reaction to increase the film thickness due to the additional generation of the organometallic complex. Therefore, when the film thickness of the organometallic complex reaches the film thickness corresponding to the film thickness generated by converting one layer of the outermost surface of the high-k insulating film 4 into the organometallic complex, the reaction to convert the high-k insulating film 4 into the organometallic complex is substantially stopped.

After the outermost surface layer of the high-k insulating film 4 is converted into the organometallic complex in the earliest stage of the rapid heating and temperature rising, when the temperature of the semiconductor substrate 1 further rises to arrive near the boiling points of each of the complex forming gas and the complex stabilizing material gas which are the components of the mixed etching gas, the molecules of the complex forming gas and the molecules of the complex stabilizing material gas which are physically adsorbed on the surface of the semiconductor substrate 1 cannot maintain the physically adsorbed state to start to be desorbed from the surface of the semiconductor substrate 1 and are swept away by the carrier gas flow to be removed from the surface of the semiconductor substrate 1. While the removal of the complex forming gas and the complex stabilizing material gas which are in the physically adsorbed state is progressed, since the latent heat of vaporization of the complex forming gas and the complex stabilizing material gas is deprived, the surface temperature of the semiconductor substrate 1 substantially does not rise much (temperatures $T_3$ and $T_4$). Since the organometallic complex has a boiling point higher than that of the complex forming gas and the complex stabilizing material gas, the organometallic complex is not desorbed at this point.

When the molecules of the complex forming gas and the molecules of the complex stabilizing material gas which are in the physically adsorbed state on the surface of the semiconductor substrate 1 are removed, the surface temperature of the semiconductor substrate 1 rapidly rises, but when the temperature arrives near a volatilization point (boiling point or sublimation point) of the organometallic complex, the molecules of the organometallic complex starts to be desorbed from the high-k insulating film 4 on the surface of the semiconductor substrate 1. At this time, since the components derived from the complex stabilizing material gas are included in the molecules of the organometallic complex, the organometallic complex is desorbed/volatilized from the surface of the high-k insulating film 4 without being decomposed and swept away by the carrier gas flow to be removed from the surface of the semiconductor substrate 1. In the example of FIG. 4, in order to completely remove the organometallic complex converted from the high-k insulating film 4, the temperature rapidly rises to the highest attainment temperature of 500° C., but it is preferable to appropriately adjust the highest attainment temperature according to the kind of high-k insulating film and the composition of the organometallic complex converted therefrom. It should be noted that since the change in temperature at the time of the desorption of the organometallic complex is determined by the balance between heat generated by a chemical bond cleaving reaction and the absorption by the latent heat of evaporation, actually, it does not necessarily indicate a relatively simple temperature change as shown in FIG. 4.

By this series of processes, after the outermost surface layer of the high-k insulating film 4 is converted into the organometallic complex, the organometallic complex is removed from the surface of the semiconductor substrate 1, and the high-k insulating film 4 in a state in which the high-k insulating film 4 is thinned by the thickness corresponding to one layer of the outermost surface layer of the high-k insulating film 4 is exposed again.

Thereafter, the catalytic gas is again introduced before the temperature of the semiconductor substrate 1 is lowered until it falls down to the gas introduction upper limit temperature $T_1$, and after the temperature of the semiconductor substrate 1 is lowered until it falls below the gas introduction upper limit temperature $T_1$ (period (f)), processings in periods (c) to (e), that is, a series of processings such as the introduction of the mixed etching gas, the uniformity in the substrate by the slow heating, the generation of the organometallic complex, the removal of the non-adsorbed gas by the carrier gas, the discharge of the extra physically adsorbed mixed etching gas by the rapid heating under the decompression, and the volatilization removal of the organometallic complex are repeated up to the desired etching depth, such that the isotropic dry removal of the high-k insulating film 4 is completed.

Since the complex forming gas included in the mixed etching gas reacts with only the insulating film (e.g., modified lanthanum silicate) that is modified by the action of the specific oxide, the specific halide, or the catalytic gas supplied through the gas supply line 15 and does not react with a substance having other compositions, for example, nitride, an etching selective ratio of the oxide with respect to the nitride is kept high. For example, a high etching selective ratio to titanium nitride (TiN) is exhibited.

The details of all the conditions such as the composition ratio of the complex forming gas and the complex stabilizing material gas which are included in the mixed etching gas, the supply concentration, the supply time, the temperature of the semiconductor substrate 1 at the time of the supply, the time until the temperature rises after the mixed etching gas is supplied need to be appropriately adjusted by the material or the thickness of the high-k insulating film 4 formed on the semiconductor substrate 1, the micro structure of the device and the like. As a general tendency, the etching rate of the mixed etching gas supplied together with the carrier gas tends to be getting faster as the concentration of the mixed etching gas to the carrier gas is high. For this reason, in the etching processing of a deep hole trench or a high aspect pattern, it is preferable to slowly change the component composition or the supply concentration of the mixed etching gas supplied. For example, at the initial stage, the mixed etching gas is supplied at a low concentration, the concentration of the mixed etching gas is slowly increased, and the mixed etching gas having a concentration of 100% is finally supplied. As described above, after the influence of the component composition, the supply concentration, the supply time, and the substrate temperature of the mixed etching gas is checked, the appropriate processing conditions are determined.

Next, the raw material for the complex forming gas which is the component for converting the high-k insulating film into the volatile organometallic complex, the raw material for the complex stabilizing material gas which is the component for increasing the stability of the volatile organometallic complex, and the raw material for the catalytic gas having a function of promoting the conversion reaction for converting into the volatile organometallic complex are described.

The fact that the mixed etching gas of the complex forming gas and the complex stabilizing material gas is generated by vaporizing the chemical liquid 30 filled in the chemical liquid tank 31 provided in the gas supply line 15 by the vaporizer 32 was described with reference to FIG. 1. In addition, the chemical liquid 30 is a raw material for generating at least two kinds of gaseous component substances, namely, the complex forming gas and the complex stabilizing material gas, and is the mixed liquid including the raw material for the complex forming gas and the raw material for the complex stabilizing material gas.

From the viewpoint of the operability and the work efficiency of the process of vaporizing the chemical liquid 30, both of the raw material for the complex forming gas and the raw material for the complex stabilizing material gas are selected from materials of which the boiling point at 1 atm does not largely exceed approximately 200° C.

The raw material for the complex forming gas is an organic compound obtained by forming at least two or more coordination bond to a transition metal atom, a so-called multidentate ligand molecule. Preferably, there are diketones or ketoester (including two C=O bonds), ketoimine (including C=O bond and C=N bond) and the like. Specific examples of the substance names for the preferable diketone may include acetylacetone, trifluoroacetylacetone, trifluorophenyl butadione, hexafluoroacetylacetone, dipivaloylmethane, thenoyltrifluoroacetone, trifluorofurylbutadione, dimethylheptafluorooctadione and the like. In addition to this, bidentate ligands such as hydroxymethylpyridine, phenanthroline, quinolinol and the like may also be applicable. It should be noted that diketone not including a fluorine atom, for example, a diketone including three or more fluorine atoms than acetylacetone (alias: 2,5-pentanedione), for example, trifluoroacetylacetone, trifluorophenylbutadione, hexafluoroacetylacetone, thenoyltrifluoroacetone, trifluorofurylbutadione, dimethylheptafluorooctadione are preferable. Since acetylacetone not including the fluorine atom has low complexation reaction activity and slow complexation reaction, but diketone including the fluorine atom has high complexation reaction activity and the rapid complex formation reaction, the application to the temperature cycle processing which repeats the plurality of processings as shown in FIG. 4 is excellent from the viewpoint of practicality. Although the stability of the organometallic complex generated from the diketone containing the fluorine atom may be inferior, in the process of the present embodiment, the organometallic complex is used together with the complex stabilizing material to be able to suppress the instability of the organometallic complex.

The raw material for the complex stabilizing material gas is an organic compound having two or more elements having an unshared electron pair such as an oxygen atom, a nitrogen atom, and a sulfur atom in the molecular skeleton thereof, preferably, 5 or more atoms except a hydrogen atom and a fluorine atom. The raw material for the complex stabilizing material gas is preferably ethers. The ethers are suitable as the raw material for the complex stabilizing material gas from the viewpoint that they do not cause the chemical reaction with the raw material for the complex forming gas as listed above. A specific example of the substance name for some of the substances may include a straight chain ether such as dimethoxyethane, diethylene glycol dimethyl ether, and propylene glycol dimethyl ether, cyclic ether such as tetrahydrofuran, 12-crown-4, and diaza-12-crown-4, triazacyclononane, cyclic amine, adiponitrile, succinonitrile and the like.

As the raw material for the catalytic gas, an organometallic complex catalyst can be used. Typically, the raw material for the catalytic gas is the organometallic complex including an iron group element (group 8 elements in a fourth period) as the metal element. A specific example may include a cobalt (Co) acetylacetonate complex. The raw material for the catalytic gas is vaporized under the decompression by the vaporizer 42 to generate the catalytic gas, which is supplied into the processing chamber through the gas supply line 15.

When hexafluoroacetylacetone (liquid diketone compound) is used as the raw material for the complex forming gas, diethylene glycol dimethyl ether (liquid straight chain ether compound) previously dehydrated is used as the raw material for the complex stabilizing material gas, and a Cobalt acetylacetonate complex is used as the catalytic gas, the silicate (lanthanum silicate) including lanthanum (La) which is group 3A metal is complexed and then evaporated to be removed, without reacting with the silicon (Si) film and with the nitride film such as the titanium nitride (TiN). On the other hand, the group 3A metal silicate does not show reactivity under the condition that the catalytic gas is not used, so the removal of the group 3A metal silicate was not observed. A part of the result thereof is shown in FIG. 5. The reaction ratio is obtained as the ratio of the mass of the mixed etching-gas-reacted and volatilized substance to the mass of the unreacted substance. By doing so, the mixed etching gas of the present embodiment selectively reacts with the high-k insulating film material including the silicate modified by the catalytic gas to produce the volatile organometallic complex, which was confirmed to be selectively removable under the decompression and heating.

The reason why the group 3A metal silicate cannot be removed without the catalytic gas is that the stability of the Si—O bond included in the silicate is high. The catalytic action of the Cobalt acetylacetonate complex is assumed as follows. By the coexistence of the Cobalt acetylacetonate complex and the silicate, it is considered that oxygen (O) of acetylacetonate ion and oxygen (O) in the silicate are substituted and thus the insertion reaction into the silicate of the Cobalt acetylacetonate complex happens. By doing so, the Si—O bond is weakened, so it is possible to remove the 3A group metal silicate. From the catalytic action assumed above, the organometallic complex used for the catalytic gas is stable and should not be decomposed promptly. In addition, although the organometallic complex used for the catalytic gas needs to have a stronger binding force than the La—O bond, the organometallic complex used for the catalytic gas should not be strongly bonded to the silicate enough that it cannot be removed by the following process using the mixed etching gas. It is considered that the iron group element having property similar to Co having good properties shows preferable properties. In addition, for the same reason, in this example, the acetylacetonate complex which has low reactivity but high stability and does not include the fluorine atom was used.

In addition, when the high-k insulating film material and the complex forming gas react with each other without the complex stabilizing material gas, the defect that residues are caused during the process of desorbing and volatilizing the organometallic complex from the surface of the high-k insulating film material was caused. These residues were a carbon-based impurity generated by decomposing the organometallic complex. Therefore, during the process of the slow heating shown in FIG. 5 (period (d)), it is necessary to set the conditions so that the adsorption concentration of the complex stabilizing material gas as well as the complex forming gas is also uniform in the surface of the semiconductor substrate 1. The same considerations are required even for the catalytic gas.

What is claimed is:

1. A method for manufacturing a semiconductor device, comprising:
    mounting a semiconductor substrate, in which a mask layer having a predetermined pattern shape is formed on a high-k insulating film including silicate, in a processing chamber;
    desorbing gas or foreign matter adsorbed on a surface of the semiconductor substrate;
    supplying catalytic gas under decompression and heating;
    cooling the semiconductor substrate after a supply of the catalytic gas is stopped and supplying reactive gas to the processing chamber in a state in which a temperature of the semiconductor substrate falls below a predetermined temperature;
    decompressing and heating an inside of the processing chamber by stopping the supply of the reactive gas; and
    exhausting a first organometallic complex from the processing chamber by vaporizing the first organometallic complex generated by reacting with a metal element included in the high-k insulating film.

2. The method for manufacturing a semiconductor device according to claim 1, wherein
    the catalytic gas is catalytic gas using a second organometallic complex, which modifies the high-k insulating film and promotes a formation reaction of the first organometallic complex, as a raw material, and
    the reactive gas is mixed gas which includes a complex forming gas reacting with the metal element included in the high-k insulating film to form the first organometallic complex and a complex stabilizing material gas increasing stability of the first organometallic complex.

3. The method for manufacturing a semiconductor device according to claim 1, wherein
    the metal element included in the high-k insulating film is a metal element classified in a fifth period in a periodic table and succeeding periods, and
    the high-k insulating film includes silicate of the metal element.

4. The method for manufacturing a semiconductor device according to claim 1, wherein
    the metal element included in the high-k insulating film is a rare earth element, and
    the high-k insulating film includes silicate of the rare earth element.

5. The method for manufacturing a semiconductor device according to claim 2, wherein
    a raw material for the complex forming gas is an organic compound obtained by forming a coordinate bond of at least two or more coordination bond to a transition metal atom, a so-called multidentate ligand molecule.

6. The method for manufacturing a semiconductor device according to claim 5, wherein
    the raw material for the complex forming gas is diketones including a fluorine atom.

7. The method for manufacturing a semiconductor device according to claim 2, wherein
    a raw material for the complex stabilizing material gas is an organic compound having two or more elements having an unshared electron pair of an oxygen atom or a nitrogen atom in a molecular skeleton and 5 or more atoms except a hydrogen atom and a fluorine atom.

8. The method for manufacturing a semiconductor device according to claim 7, wherein
    the raw material for the complex stabilizing material gas is ethers.

9. The method for manufacturing a semiconductor device according to claim 2, wherein
    the second organometallic complex is an organometallic complex including an iron group element.

10. The method for manufacturing a semiconductor device according to claim 9, wherein
    the second organometallic complex is an organometallic complex including cobalt.

11. The method for manufacturing a semiconductor device according to claim 9, wherein
    the second organometallic complex is an organometallic complex not including a fluorine atom.

* * * * *